(12) United States Patent
Lu et al.

(10) Patent No.: US 9,711,474 B2
(45) Date of Patent: Jul. 18, 2017

(54) SEMICONDUCTOR PACKAGE STRUCTURE WITH POLYMERIC LAYER AND MANUFACTURING METHOD THEREOF

(71) Applicant: TAIWAN SEMICONDUCTOR MANUFACTURING COMPANY LTD., Hsinchu (TW)

(72) Inventors: Gia-Her Lu, Hsinchu County (TW); Liang-Chen Lin, Hsinchu County (TW); Tung-Chin Yeh, Miaoli County (TW); Jyun-Lin Wu, Hsinchu (TW); Tung-Jiun Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/495,575

(22) Filed: Sep. 24, 2014

(65) Prior Publication Data

US 2016/0086902 A1  Mar. 24, 2016

(51) Int. Cl.
*H01L 23/00* (2006.01)
*H01L 21/683* (2006.01)
(Continued)

(52) U.S. Cl.
CPC .......... *H01L 24/14* (2013.01); *H01L 21/6836* (2013.01); *H01L 23/147* (2013.01); *H01L 23/5384* (2013.01); *H01L 24/05* (2013.01); *H01L 24/11* (2013.01); *H01L 24/17* (2013.01); *H01L 24/32* (2013.01); *H01L 24/33* (2013.01); *H01L 24/73* (2013.01); *H01L 24/81* (2013.01); *H01L 24/92* (2013.01); *H01L 24/94* (2013.01); *H01L 24/97* (2013.01); *H01L 21/563* (2013.01); *H01L 23/3157* (2013.01); *H01L 23/3171* (2013.01); *H01L 23/49816* (2013.01); *H01L 23/5386* (2013.01); *H01L 23/562* (2013.01); *H01L 24/02* (2013.01); *H01L 24/03* (2013.01);
(Continued)

(58) Field of Classification Search
CPC ...................................................... H01L 23/00
USPC ............................................ 438/113; 257/737
See application file for complete search history.

(56) References Cited

U.S. PATENT DOCUMENTS 6,274,474 B1 *  8/2001  Caletka ............. H01L 23/49816
                                                  257/738
6,569,753 B1 *  5/2003  Akram .................... H01L 24/11
                                                  257/E21.508
(Continued)

*Primary Examiner* — Caleb Henry
(74) *Attorney, Agent, or Firm* — WPAT, P.C., Intellectual Property Attorneys; Anthony King

(57) ABSTRACT

A semiconductor package structure includes a semiconductor substrate including a plurality of through substrate vias (TSV) extending from a first surface to a second surface of the semiconductor substrate, wherein the second surface is opposite to the first surface; a plurality of conductive bumps on the second surface and connected to a corresponding TSV; a polymeric layer on the second surface and surrounding a lower portion of a corresponding conductive bump. The polymeric layer includes a first portion configured as a blanket covering a periphery region of the semiconductor substrate; and a second portion in a core region of the semiconductor substrate and configured as a plurality of isolated belts, wherein each of the isolated belts surrounds a corresponding conductive bump.

20 Claims, 8 Drawing Sheets

(51) Int. Cl.
*H01L 23/14* (2006.01)
*H01L 23/538* (2006.01)
*H01L 23/31* (2006.01)
*H01L 21/56* (2006.01)
*H01L 25/065* (2006.01)
*H01L 23/498* (2006.01)

(52) U.S. Cl.
CPC .............. *H01L 24/06* (2013.01); *H01L 24/13* (2013.01); *H01L 24/16* (2013.01); *H01L 24/27* (2013.01); *H01L 24/29* (2013.01); *H01L 24/83* (2013.01); *H01L 25/0655* (2013.01); *H01L 2221/68327* (2013.01); *H01L 2221/68331* (2013.01); *H01L 2224/02372* (2013.01); *H01L 2224/03002* (2013.01); *H01L 2224/036* (2013.01); *H01L 2224/0401* (2013.01); *H01L 2224/04026* (2013.01); *H01L 2224/05025* (2013.01); *H01L 2224/0569* (2013.01); *H01L 2224/05073* (2013.01); *H01L 2224/05147* (2013.01); *H01L 2224/05155* (2013.01); *H01L 2224/05557* (2013.01); *H01L 2224/05569* (2013.01); *H01L 2224/05611* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/05687* (2013.01); *H01L 2224/06181* (2013.01); *H01L 2224/10126* (2013.01); *H01L 2224/11002* (2013.01); *H01L 2224/11003* (2013.01); *H01L 2224/1131* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/131* (2013.01); *H01L 2224/133* (2013.01); *H01L 2224/13014* (2013.01); *H01L 2224/13025* (2013.01); *H01L 2224/13111* (2013.01); *H01L 2224/13116* (2013.01); *H01L 2224/13144* (2013.01); *H01L 2224/13155* (2013.01); *H01L 2224/13294* (2013.01); *H01L 2224/14131* (2013.01); *H01L 2224/14135* (2013.01); *H01L 2224/14136* (2013.01); *H01L 2224/14177* (2013.01); *H01L 2224/14179* (2013.01); *H01L 2224/16227* (2013.01); *H01L 2224/1703* (2013.01); *H01L 2224/17181* (2013.01); *H01L 2224/32013* (2013.01); *H01L 2224/32058* (2013.01); *H01L 2224/32106* (2013.01); *H01L 2224/3303* (2013.01); *H01L 2224/33181* (2013.01); *H01L 2224/73204* (2013.01); *H01L 2224/81005* (2013.01); *H01L 2224/81193* (2013.01); *H01L 2224/81815* (2013.01); *H01L 2224/83102* (2013.01); *H01L 2224/83855* (2013.01); *H01L 2224/92* (2013.01); *H01L 2224/92125* (2013.01); *H01L 2224/92222* (2013.01); *H01L 2224/92225* (2013.01); *H01L 2224/92242* (2013.01); *H01L 2224/94* (2013.01); *H01L 2224/97* (2013.01); *H01L 2924/00011* (2013.01); *H01L 2924/01322* (2013.01); *H01L 2924/15311* (2013.01); *H01L 2924/18161* (2013.01); *H01L 2924/3512* (2013.01)

(56) References Cited

U.S. PATENT DOCUMENTS

| | | | | |
|---|---|---|---|---|
| 6,578,755 | B1* | 6/2003 | Elenius | B23K 3/0623 228/123.1 |
| 6,882,049 | B2* | 4/2005 | Grigg | H01L 24/11 257/688 |
| 7,122,459 | B2* | 10/2006 | Feng | H01L 24/11 257/E21.508 |
| 7,199,037 | B2* | 4/2007 | Luo | H01L 21/561 257/E21.503 |
| 7,291,548 | B2* | 11/2007 | Suh | H01L 23/562 257/E23.194 |
| 7,473,998 | B2* | 1/2009 | Tsai | H01L 24/11 257/678 |
| 7,557,452 | B1* | 7/2009 | Williams | H01L 23/49811 257/697 |
| 8,138,426 | B2* | 3/2012 | Matsuno | H01L 24/16 174/260 |
| 8,503,186 | B2* | 8/2013 | Lin | H01L 21/76898 257/433 |
| 8,754,523 | B2* | 6/2014 | Coffy | H01L 23/5389 257/693 |
| 9,034,696 | B2* | 5/2015 | Mohammed | H01L 23/28 257/790 |
| 9,241,403 | B2* | 1/2016 | Pares | H05K 1/0296 |
| 9,401,339 | B2* | 7/2016 | Yap | H01L 24/14 |
| 2005/0199995 | A1* | 9/2005 | Nomoto | H01L 23/12 257/692 |
| 2006/0005986 | A1* | 1/2006 | Alcoe | H05K 3/3436 174/534 |
| 2006/0040567 | A1* | 2/2006 | Bernier | H01L 21/563 439/738 |
| 2008/0116574 | A1* | 5/2008 | Fan | H01L 23/3128 257/738 |
| 2011/0170266 | A1* | 7/2011 | Haensch | B32B 37/02 361/722 |
| 2011/0304008 | A1* | 12/2011 | Yang | H01L 23/3128 257/506 |
| 2012/0104580 | A1* | 5/2012 | Feng | H01L 21/561 257/673 |
| 2012/0139090 | A1* | 6/2012 | Kim | H01L 25/16 257/659 |
| 2012/0170887 | A1* | 7/2012 | Yang | G02B 6/132 385/14 |
| 2013/0087908 | A1* | 4/2013 | Yu | H01L 24/13 257/737 |
| 2013/0134553 | A1* | 5/2013 | Kuo | H01L 23/66 257/532 |
| 2013/0134559 | A1* | 5/2013 | Lin | H01L 23/49827 257/620 |
| 2013/0140690 | A1* | 6/2013 | Lin | H01L 21/76898 257/737 |
| 2013/0168850 | A1* | 7/2013 | Samoilov | H01L 21/76898 257/737 |
| 2014/0134796 | A1* | 5/2014 | Kelly | H01L 21/50 438/107 |
| 2014/0134803 | A1* | 5/2014 | Kelly | H01L 21/76251 438/118 |
| 2014/0134804 | A1* | 5/2014 | Kelly | H01L 23/147 438/118 |
| 2014/0144690 | A1* | 5/2014 | Pares | H05K 1/0296 174/261 |

(56) References Cited

U.S. PATENT DOCUMENTS

| | | | |
|---|---|---|---|
| 2014/0210080 A1* | 7/2014 | Chang | H01L 23/49816 257/738 |
| 2014/0217585 A1* | 8/2014 | Mallik | H01L 23/3114 257/738 |
| 2014/0262475 A1* | 9/2014 | Liu | H01L 23/5389 174/377 |
| 2014/0264834 A1* | 9/2014 | Chen | H01L 21/6835 257/737 |
| 2014/0264839 A1* | 9/2014 | Tsai | H01L 23/49816 257/737 |
| 2014/0332966 A1* | 11/2014 | Xiu | H01L 25/00 257/773 |
| 2014/0367867 A1* | 12/2014 | Lin | H01L 25/50 257/777 |
| 2015/0001717 A1* | 1/2015 | Karhade | H01L 24/17 257/741 |
| 2015/0001733 A1* | 1/2015 | Karhade | H01L 23/538 257/774 |
| 2015/0014844 A1* | 1/2015 | Wu | H01L 23/585 257/737 |
| 2015/0076636 A1* | 3/2015 | Beer | G01R 19/0092 257/427 |
| 2015/0097284 A1* | 4/2015 | Uzoh | H01L 23/49811 257/737 |
| 2015/0102502 A1* | 4/2015 | Chiu | H01L 25/105 257/774 |
| 2015/0111364 A1* | 4/2015 | Lei | H01L 21/78 438/462 |
| 2015/0140801 A1* | 5/2015 | Toh | H01L 24/11 438/613 |
| 2015/0175407 A1* | 6/2015 | Cheng | B81C 1/00246 257/415 |
| 2015/0194361 A1* | 7/2015 | Hou | H01L 24/97 257/738 |
| 2015/0279776 A1* | 10/2015 | Hu | H01L 23/49861 257/668 |
| 2015/0294958 A1* | 10/2015 | Mallik | H01L 25/0657 438/109 |
| 2015/0303174 A1* | 10/2015 | Yu | H01L 25/0657 257/712 |
| 2016/0043051 A1* | 2/2016 | Lin | H01L 24/17 257/737 |

* cited by examiner

SEMICONDUCTOR PACKAGE STRUCTURE WITH POLYMERIC LAYER AND MANUFACTURING METHOD THEREOF

FIELD

The present disclosure relates to a semiconductor package structure, and more specifically to a structure of a chip on wafer on substrate.

BACKGROUND

A significant trend throughout integrated circuit (IC) development is the downsizing of IC components. These integration improvements are two-dimensional (2D) in nature where the ICs are integrated on a surface of a semiconductor wafer. Although dramatic improvement in lithography has enabled greater results in 2D IC formation, there are physical limits to the density that can be achieved in two dimensions. Also, when more devices are put into one chip, more complex design costs are required.

In an attempt to further increase circuit density, three-dimensional (3D) ICs have been developed. For example, two dies are bonded together; and electrical connections are formed between each die. The stacked dies are then bonded to a carrier substrate by using wire bonds and conductive pads. In another example, a chip on (chip on substrate) (Co(CoS)) or (Chip on wafer) on substrate ((CoW)oS) technique is developed.

However, conductive bumps adjacent to edges or corners of an interposer or dies can result in cracking during cooling down or a stressing test. During cooling down of chip joints, conductive bumps disposed between the interposer and the circuit board are subject to shearing and stress, which results from the different thermal expansion due to different thermal coefficients.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
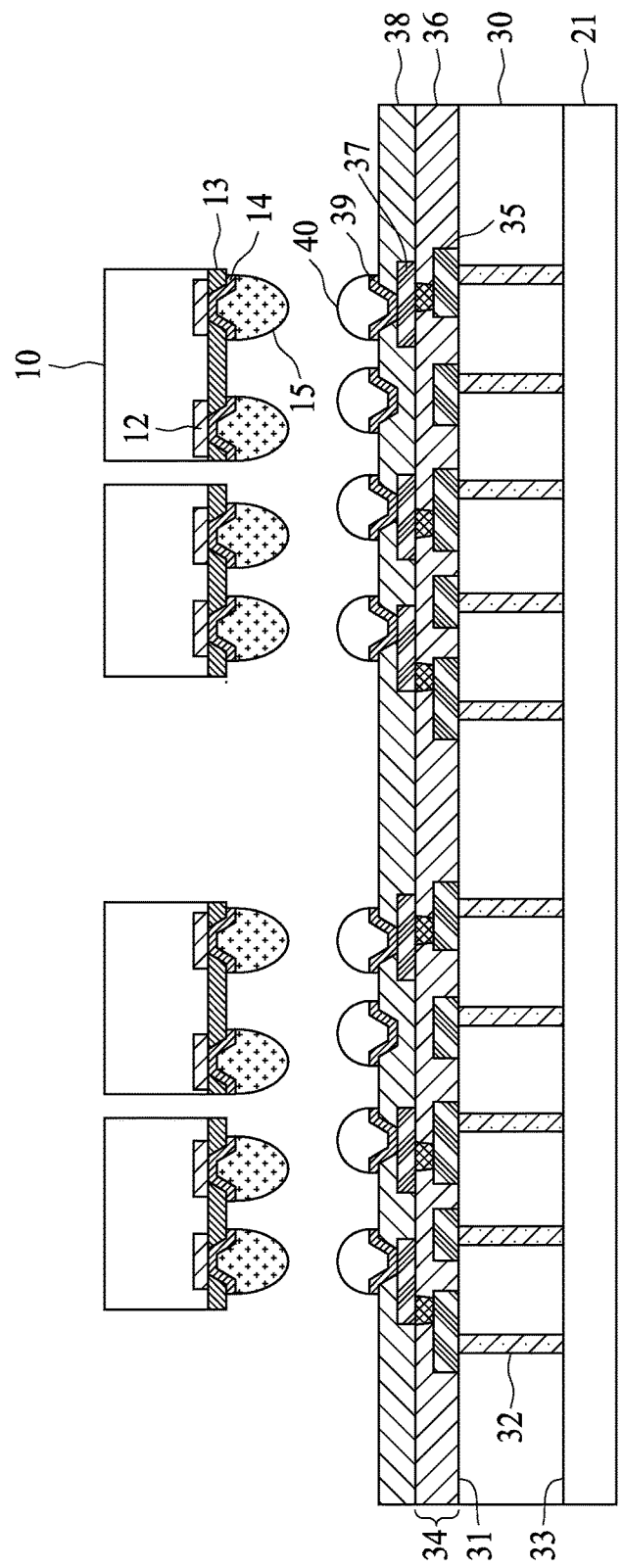
FIGS. 1-4 represent a method of manufacturing a semiconductor package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

A current common requirement for an advanced electronic circuit is the use of multiple integrated circuit devices ("dies") integrated in a single packaged component. As such, the configuration of a three-dimensional package is developed; for example, chip on substrate (CoS) or chip-on-wafer-on-substrate (CoWoS) techniques. The integrated circuit dies with different functions are mounted to a wafer by using conductive bumps, such as micro bumps. A thermal reflow step is performed to complete the mechanical and electrical connection between the dies and the wafer by melting and reflowing the solder balls or bumps. The integrated circuit dies communicate with each other through the redistribution layer ("RDL") or conductors within the wafer. In addition, the integrated circuit dies are coupled with conductive bumps of the opposite side of the wafer by through substrate vias. The conductive bumps of the opposite side of the wafer are larger than the conductive bumps between the IC dies and the wafer, which refers to "ball grid array" or controlled collapse chip connection (C4) bumps. After the IC dies are mounted to the wafer and the C4 bumps are prepared, a singulation process is performed on the wafer to form pieces of interposers stacked with IC dies. During the singulation performed on wafers, the interposers are diced as rectangular shapes with edges and corners. Later, the interposers are mounted on a circuit board by using the C4 bumps. The IC dies thus are able to receive and transmit signals from outer devices by the chip-on-wafer-on-substrate package. As the amount and complexity of the dies mounted in such a package increase, the multi-chip package can achieve the configuration of a system on a chip (SoC).

However, since there is a thermal mismatch between the interposer and the circuit board, the conductive bumps are subject to damages caused by the physical stress of different temperature coefficients. During mounting processes, the stack of the interposer and the circuit board is heated and cooled down repeatedly in a thermal cycling. Since the interposer has a temperature coefficient different from that of the circuit board, the different temperature coefficients cause different thermal expansion. The different thermal expansion causes physical stress on the conductive bumps, underfill layer and underlying laminates. Particularly, the conductive bumps and underlying dielectric materials adjacent to the corners/edges of the interposer are subject to serious stress, which causes conductive bump cracks and dielectric film delamination. Sometimes, the underfill material adjacent to the corners/edges also suffers from the stress, thus causing an underfill delamination, which exacerbates the delamination problem. The present disclosure provides a semiconductor package structure and a method thereof to protect a CoWoS package from conductive bump cracks or dielectric film delamination during thermal cycling or reliability stressing. The semiconductor package structure has a polymeric layer on the corner/edge regions as a stress buffer.

FIGS. 1-6 represent a method of manufacturing a semiconductor package structure in accordance with some embodiments of the present disclosure. Each figure represents a stage of the method in a cross-sectional perspective view.

Referring to FIG. 1, several dies 10 are positioned to mount on a wafer 30, which refers to a chip-on-wafer process. Each die 10 has terminals 12, which refer to conductive pads or bond pads. A dielectric layer 13 or a passivation layer is deposited on the terminals 12 by chemical vapor deposition (CVD) and physical vapor deposition (PVD). Later, lithography and etching processes are performed to expose the terminals 12, thus forming an opening. An under bump metallization (UBM) layer is deposited on the terminals 12 and then patterned to form the UBM 14, which is also referred to as ball-limiting metallurgy (BLM). The UBM 14 defines a size of a conductive bump after reflow and reacts with the conductive bump so as to provide effective adhesion and a barrier between the conductive bump and underlying wirings. As such, the UBM 14 provides additional adhesion between the terminals 12 and conductive bumps 15 and increases solderability. Materials of the UBM 14 include, for example, titanium (Ti), tantalum (Ta), titanium nitride (TiN), tantalum nitride (TaN), copper (Cu), copper alloys, nickel (Ni), tin (Sn), gold (Au), or combinations thereof. The conductive bumps 15 are formed on the UBM 14 by evaporation or an electroplating process. Further, the dies 10 are chosen and put together for certain functions and include, for example, microprocessor devices with program memory storage such as FLASH or EEPROM devices, or microprocessors with application specific processors such as baseband transceivers, graphics processors, cache memory devices, memory management devices, and analog to digital converters for sensor applications.

The wafer 30 herein is made of, for example, silicon or other suitable materials such as ceramic, glass, plastic, resin or epoxy. The wafer 30 includes through substrate vias (TSVs) 32 extending from a first surface 31 to a second surface 33, wherein the TSVs 32 are also regarded as through interposer vias (TIV) if the wafer 30 is diced. A carrier 21 is formed in contact with a second surface 33, which is temporary and made of any strippable or easily removed material, for example, films, tapes, liquid adhesives and the like. The carrier 21 holds and supports the wafer 30 during the following processes. A redistribution layer (RDL) 34 formed in contact with the first surface 31 includes patterned conductors 35 and a dielectric layer 36. The dielectric layer 36 is made of dielectric material for insulating the wiring including, for example, oxide or nitride. The patterned conductors 35 are arranged as horizontal and vertical portions so as to remap a layout for the dies 10. Further, the patterned conductors 35 are coupled with the TSVs 32 in order to create an electrical connection. The patterned conductors 35 are made of conductive material suitable for interconnection, for example, copper or tungsten. By using the RDL 34, changes of the dies 10 or the conductive bump patterns are made without modifying the system board since the dies 10 are allowed to communicate each other through the RDL 34. The RDL 34 thus is able to change the layout of new dies or new bump patterns for particular functions. This flexibility saves cost and allows any changes of dies or die vendors.

A conductive layer is formed on the RDL 34 and then patterned to form conductive pads 37. Later, a dielectric layer 38 is deposited on the RDL 34 and the conductive pads 37 by chemical vapor deposition (CVD) and physical vapor deposition (PVD). Later, lithography and etching processes are performed to expose the conductive pads 37, thus forming openings. An under bump metallization (UBM) layer is deposited on the conductive pads 37 and then patterned to form the UBM 39. The UBM 39 is in contact with the conductive pads 37 and supported by the dielectric layer 38. Conductive bumps 40 are formed on the UBM 39 by evaporation, an electroplating process, dropping balls, solder paste in a screen printing operation, electroless or electroplating approaches, controlled collapse chip connection (C4) plating or C4NP (C4 New Process) solder transfers. The conductive bumps 15 are aligned with the conductive bumps 40 respectively in this operation.

Figure 2:
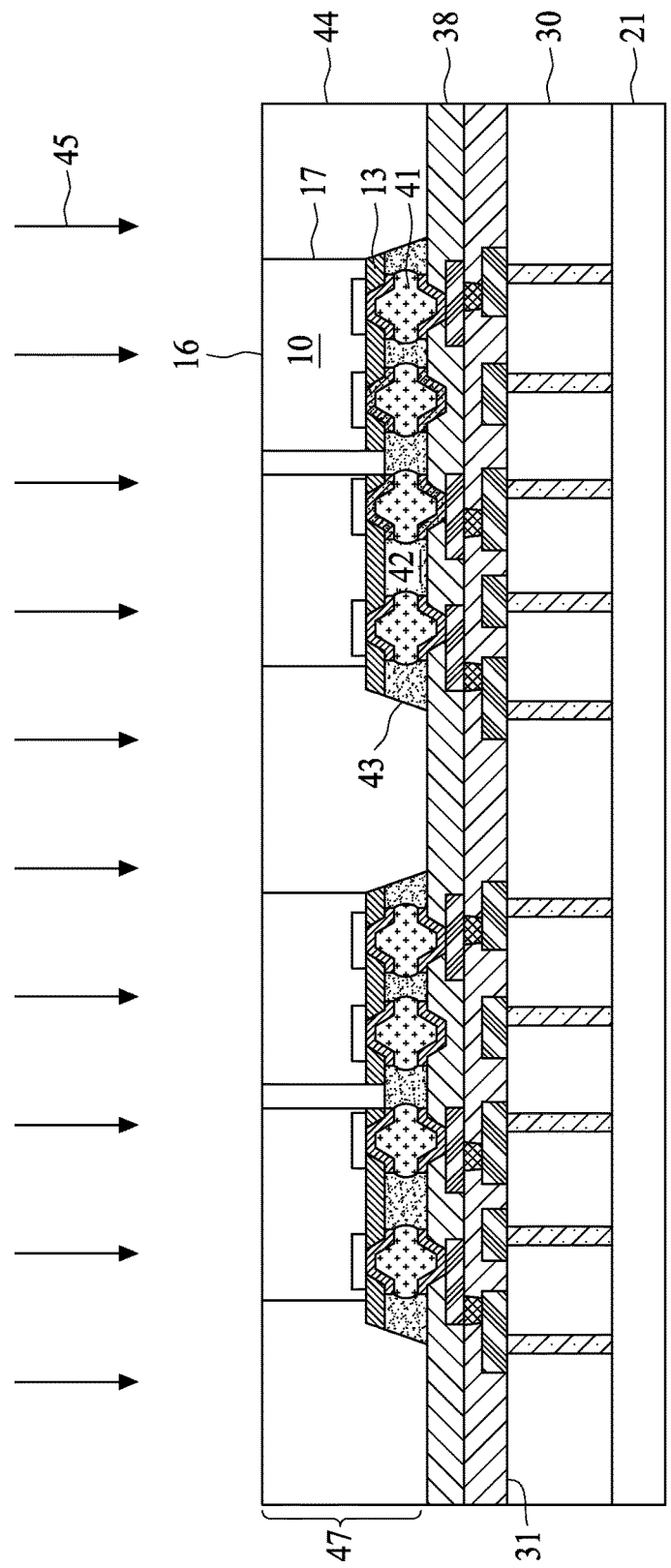

Referring to FIG. 2, a thermal reflow process is used to cause the conductive bumps 15 and the conductive bumps 40 to be softened. After cooling these reflown bumps, the conductive bumps 15 and the conductive bumps 40 are melted to form conductive bumps 41 between the dies 10 and the wafer 30. The conductive bumps 40 provide an attachment and an electrical connection, wherein the conductive bumps 40 are implemented by micro bumps or controlled collapse chip connection (C4) bumps. Following the thermal reflow process, an underfill material is dispensed to form an underfill layer 42 between the dies 10 and the wafer 30. The underfill material is dispensed along edges of the dies 10 by using syringes or needles and drawn into the gaps between the wafer 30 and the dies 10 by capillary action. The underfill material is also disposed, thereby surrounding the conductive bumps 41. The underfill material includes, for example, compliant epoxies that are liquid at temperatures above room temperature, and have rapid cure times especially at elevated temperatures and low viscosity during dispensing. The underfill layer 42 includes fillets 43 at each edge of the dies 10, wherein the fillets 43 are formed outside of the dies 10 after the underfill layer 42 is cured. The fillets 43 have an outside surface that slopes up from the dielectric layer 13 to the dielectric layer 38, thus sealing the gaps between the dies 10 and the wafer 30. The underfill layer 42 provides a flexible compliant material surrounding the conductive bumps 40 and an adhesion between the dies 10 and the wafer 30. Further, the underfill layer 42 provides a stress relief during thermal cycling so as to prevent the conductive bumps 41 and the dies 10 from cracking.

A molding layer 44 is formed over the wafer 30 and surrounds the dies 10, wherein the molding layer 44 covers the dielectric layer 38 and sidewalls 17 of the dies 10. A portion of the molding layer 44 is removed by using a backside grinding 45 or another mechanical operation, thus exposing a top surface 16 of the dies 10. After the molding process and the backside grinding 45, molded dies or molded chips 47 connected to the wafer 30 are provided. A thermal interface material ("TIM") or a heat spreader (not shown) is applied on the top surface 16. The use of the heat spreader or the TIM layer greatly improves the thermal performance of the dies 10 and decreases the temperatures of the dies 10 during operations.

Figure 3:
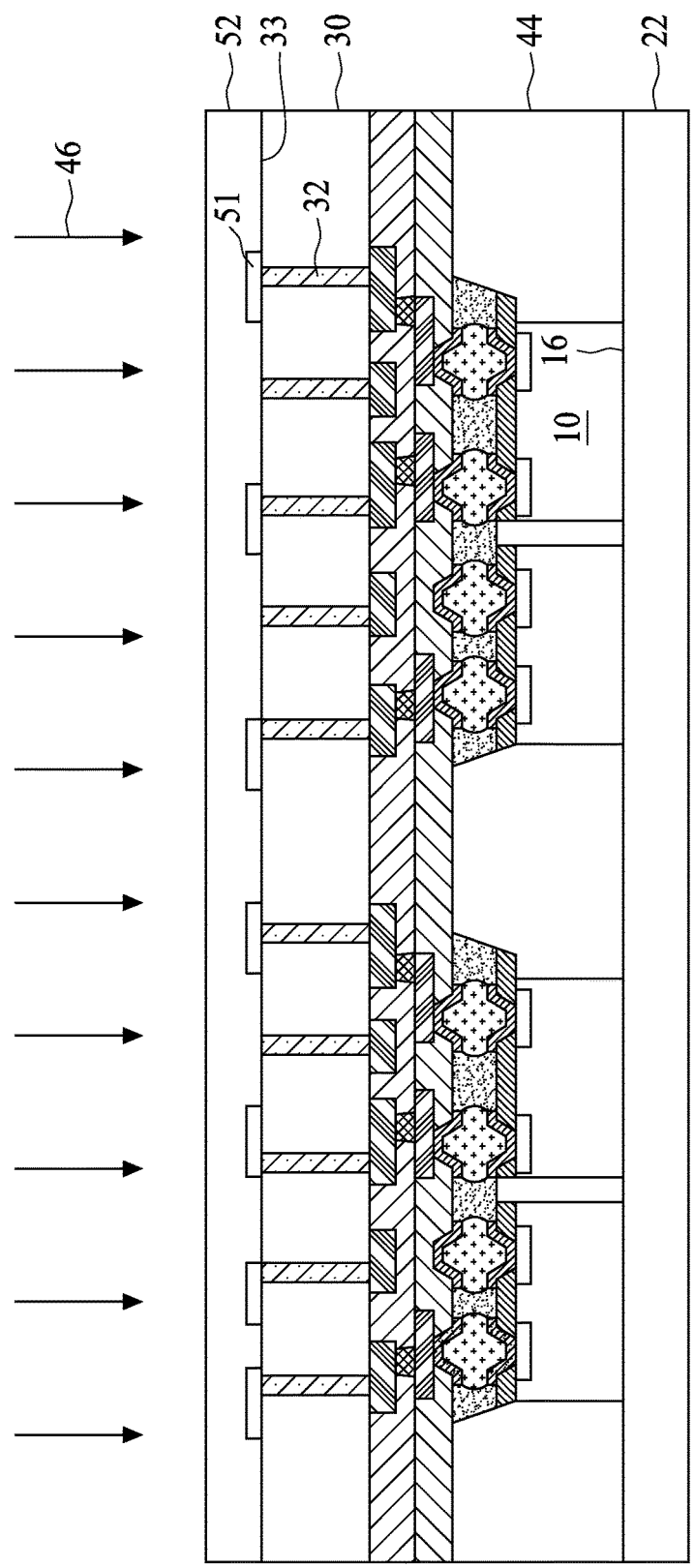

Referring to FIG. 3, a carrier 22 is formed on the top surface 16 in advance, which is temporary and made of any strippable or easily removed material, for example, films, tapes, liquid adhesives and the like. The carrier 22 holds and supports the wafer 30 during the following processes. After the carrier 22 is formed, the carrier 21 is then removed. The wafer 30 is turned upside down for further processes on the second surface 33, wherein the second surface 33 faces upward. A conductive layer is deposited on the second surface 33 and then patterned to form conductive pads 51 connected to the TSVs 32. The conductive pads 51 are made of conductive material, for example, copper (Cu), copper alloys, or nickel (Ni). A polymeric layer 52 is deposited on the second surface 33 and the conductive pads 51 by a deposition 46, wherein the polymeric layer 52 is formed on predetermined areas where the positions are reserved for interposers. The predetermined areas of interposers have a triangular shape or other shapes where the positions of each interposer shall be determined before a dicing process. The polymeric layer 52 is made of one or two suitable polymer materials such as epoxy, polyimide (PI), benzocyclobutene (BCB), polybenzoxazole (PBO), photosensitive polyimide material (PSPI), or soft organic materials.

Figure 4:
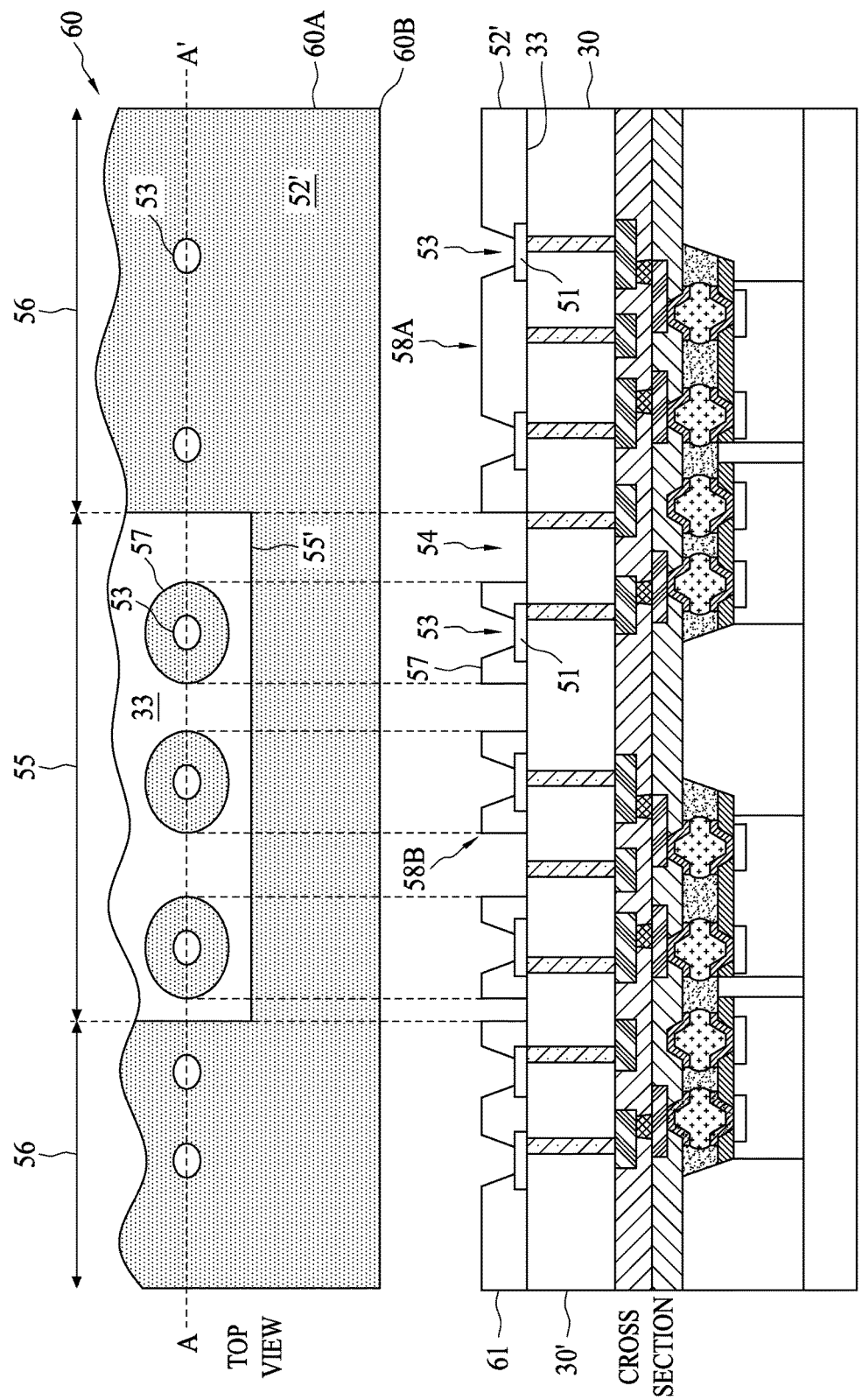

Referring to FIG. 4, it depicts a top view and a cross-sectional view for illustrating one of the predetermined areas for interposers, for example, a predetermined area 60. The top view is corresponding to the cross-sectional view. In the top view, the predetermined area 60 is implemented as a triangular or a square shape. A dash line A-A' is drawn across the top view of the predetermined area 60, wherein the dash line A-A' cuts the predetermined area 60 so as to show the cross-sectional view. Before patterning the polymeric layer 52, a core region 55 and a periphery region 56 of the predetermined area 60 are determined, wherein the periphery region 56 includes a bandwidth of at least 3 times that of a minimum pitch of the conductive pads 51. Concerning the core region 55 in the top view, the core region 55 is located on a central region of the predetermined area 60, which can be a triangular or a square shape. Concerning the periphery region 56 in the top view, the periphery region 56 is an outer portion of the predetermined area 60 extending from a virtual boundary 55' to edges 60A of the predetermined area 60. The bandwidth measured orthogonally from the virtual boundary 55' to the edges 60A is equivalent to at least 3 times that of a smallest pitch between the conductive pads 51. The smallest pitch is measured form a center of a conductive pad 51 to a center of an adjacent conductive pad.

The polymeric layer 52 covering the predetermined area 60 is then patterned to form a polymeric layer 52', wherein a portion of the polymeric layer 52 is removed in order to expose the conductive pads 51 by using lithography or etching processes, thus forming openings 53. The openings 53 in the top view are a plurality of circles in the polymeric layer 52', wherein the conductive pads 51 underneath the openings 53 can be observed. Further, the openings 53 in the cross-sectional view are located on the conductive pads 51 and are surrounded by the polymeric layer 52' with a thickness.

Before patterning the polymeric layer 52, positions of isolated circles 57 in the core region 55 of the predetermined area 60 are also determined. During the patterning, another portion of the polymeric layer 52 is also removed so as to form trenches 54 in the core region 55 of the predetermined area 60. The trenches 54 in the top view hollow out the polymeric layer 52 in the core region 55 so as to form isolated circles 57 or ovals. That is, the trenches 54 isolate the isolated circles 57 and expose portions of the second surface 33 in the core region 55. In each of the isolated circles 57, the openings 53 also expose the conductive pads 51 and located in the center of the isolated circles 57. Diameters of the isolated circles 57 are greater than diameters of the openings 53 as shown in the top view. The isolated circles 57 in the cross-sectional view are regarded as islands elevated above the second surface 33.

Therefore, after the patterning of the polymeric layer 52, the polymeric layer 52' covering the periphery region 56 of the predetermined area 60 is remained. The polymeric layer 52' includes a first portion 58A and a second portion 58B, wherein the first portion 58A is configured as a blanket covering the periphery region 56 of the predetermined area 60. The second portion 58B is located in the core region 55 of the predetermined area 60 and configured as the isolated circles 57 or ovals. Specifically, the polymeric layer 52' covers the edges 60A and the corners 60B of the predetermined area 60, wherein the first portion 58A includes a sidewall 61 coplanar with a sidewall 30' of the wafer 30. Since the conductive bumps and underlying dielectric materials adjacent to the corners 60B/edges 60A of an interposer are subject to serious stress, the polymeric layer 52' is deposited particularly in contact with the corners 60B/edges 60A in order to release the stress. That is, the polymeric layer 52' provides a stress relief for the conductive bumps and wirings adjacent to the corners 60B/edges 60A during thermal cycles or a stress testing.

In some embodiments, the coverage of the polymeric layer 52' on the second surface 33 is at least 30% of the predetermined area 60. Alternatively, the coverage of the polymeric layer 52' on the second surface 33 is about 30% to 60% of the predetermined area 60. In an embodiment, the coverage of the polymeric layer 52' on the second surface 33 is about 40% to 50% of the predetermined area 60. In an embodiment, the polymeric layer 52' in the periphery region 56 includes a thickness greater than a thickness of the polymeric layer 52' in the core region 55. As such, the ability to release mechanical stress of the polymeric layer 52' on the edges 60A can be improved.

Figure 5A:
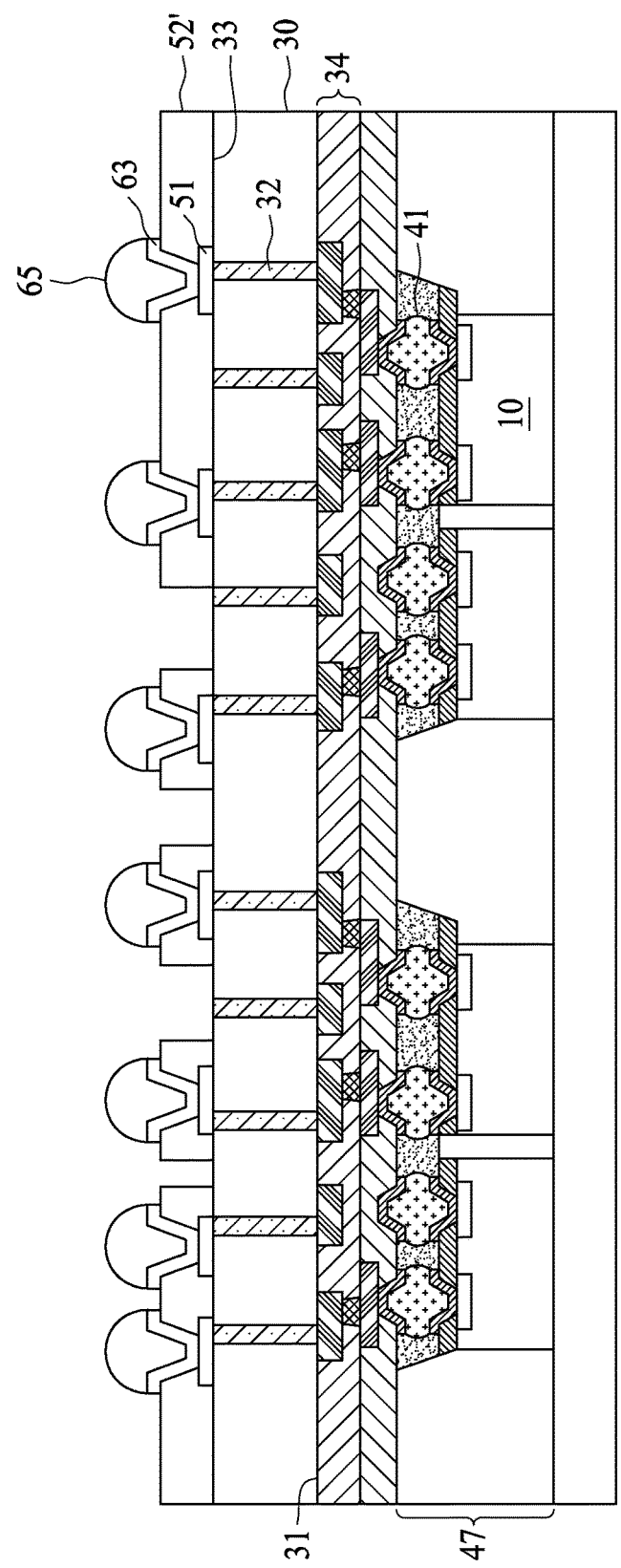
FIGS. 5A-5C depict a top view and a cross-sectional view of a configuration of a polymeric layer in accordance with some embodiments of the present disclosure.

Referring to FIG. 5A, an under bump metallization (UBM) layer is deposited over the second surface 33 and patterned to form UBMs 63. The UBMs 63 electrically connect with the conductive pads 51, wherein the UBMs 63 are surrounded and supported by the polymeric layer 52'. Materials of the UBMs 63 provide additional adhesion to the conductive pads 51 and increase solderability, wherein the materials include at least one metallization layer including titanium (Ti), tantalum (Ta), titanium nitride (TiN), tantalum nitride (TaN), copper (Cu), copper alloys, nickel (Ni), tin (Sn), gold (Au), or combinations thereof. The UBMs 63 serve as an adhesion layer between conductive pads 51 and conductive bumps. Alternatively, the UBMs 63 can be omitted by directly soldering on the conductive pads 51.

Next, conductive bumps 65 are disposed on the UBMs 63, wherein the conductive bumps 65 are implemented by controlled collapse chip connection (C4) bumps. The polymeric layer 52' surrounds a lower portion of a corresponding conductive bump 65. The conductive bumps 65 are formed by several ways, for example, using solder paste in a screen printing operation, electroless or electroplating approaches, controlled collapse chip connection (C4) plating or C4NP (C4 New Process) solder transfers. The conductive bumps 65 are made of lead based material such as lead-tin (Pb/Sn) compounds or lead free eutectics including tin, copper, silver, (Sn/Ag/Cu solder bumps may be used and are sometimes called "SAC" bumps), nickel, gold, and other lead free materials. After the conductive bumps 65 are deposited or electroplated on the UBMs 63, a thermal reflow process is performed to soften and reshape the conductive bumps 65. During melting, the conductive bumps 65 are limited by the UBMs 63. Further, the conductive bumps 65 are larger than the conductive bumps 41 interconnected between the RDL 34 and the dies 10 since the scale of the dies 10 is smaller than the following circuit board. The conductive bumps 65 are coupled with the molded chips 47 mounted to the wafer 30 through the TSVs 32. In an embodiment, the conductive bumps 65 have an oval shape, which is sufficient to reduce a shear force induced between two different layers.

Figure 5B:
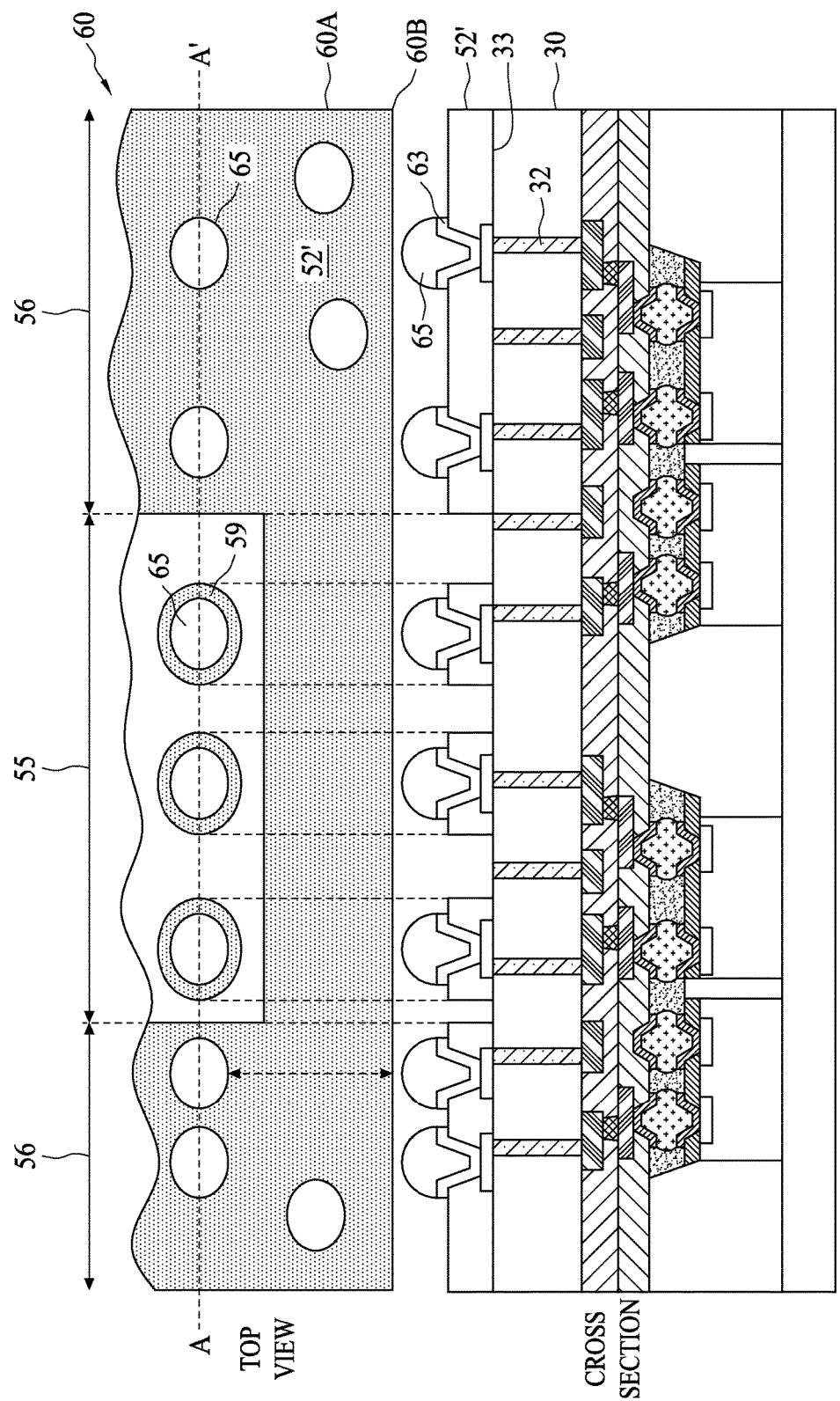

Referring to FIG. 5B, it depicts a corresponding top view and a cross-sectional view of a configuration of the second surface 33. The top view is corresponding to the cross-sectional view. A dash line A-A' is drawn across a top view of the predetermined area 60, wherein the dash line A-A' cuts the predetermined area 60 so as to show a cross-sectional view. Particularly, the dash line A-A' is drawn across the conductive bumps 65 both in the core region 55 and the periphery region 56. The conductive bumps 65 extrude from the polymeric layer 52' and are coupled with the TSVs 32 in the cross-sectional view. The conductive bumps 65 in the top view are disposed in the core region 55 and the periphery region 56, wherein a portion of the conductive bumps 65 are located adjacent to edges 60A of the predetermined area 60. In an embodiment, the conductive bumps 65 are distal from corners 60B of the predetermined area 60 because serious stresses will occur at the corners 60B after dicing. The conductive bumps 65 and underlying layers adjacent to the corners 60B/edges 60A of the predetermined area 60 are subject to serious stress, which causes conductive bump cracking and film delamination. The polymeric layer 52' in the cross-sectional view surrounds and supports a lower portion of a corresponding conductive bump 65 so as to release a physical stress. In addition, the polymeric layer 52' in the top view covering the edges 60A and corners 60B of the predetermined area 60 provides a stress relief so as to prevent failures of the conductive bumps 65 due to thermal mismatch among different materials. Further, the polymeric layer 52' covering the periphery region 56 is able to absorb or disperse the stress caused by different thermal expansion among the wafer 30, the UBMs 63 or other laminates, thus sufficiently preventing the conductive bumps 65 from cracking or die cracking. The polymeric layer 52' circulating the conductive bumps 65 in the core region 55 forms isolated belts 59 or isolated rings as shown in the top view, wherein each of the isolated belts 59 surrounds a corresponding conductive bump 65. In addition, each of the isolated belts 59 includes a circular shape or an oval shape, wherein the isolated belts 59 have a diameter greater than a diameter of the conductive bump 65. Further, the isolated belts 59 encompass a corresponding conductive bump 65 so that the isolated belts 59 are able to disperse the effect of stresses, thus sufficiently preventing conductive bump cracking or die cracking. Therefore, the conductive bumps 65 adjacent to edges 60A of the predetermined area 60 will not be abandoned since the polymeric layer 52' prevents the conductive bumps 65 from cracking.

Figure 5C:
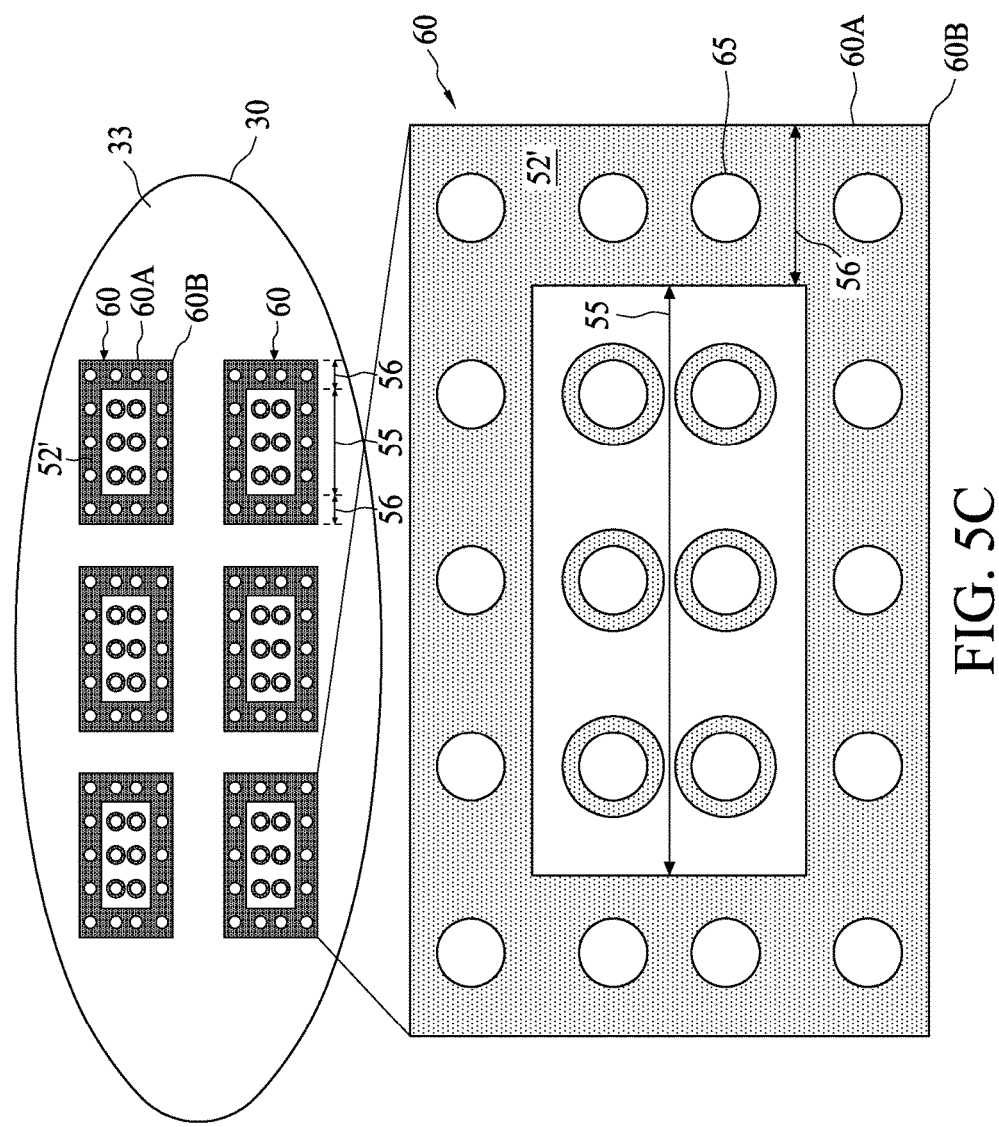

Referring to FIG. 5C, it depicts a wafer-level view of the second surface 33, wherein the first surface 31 cannot be seen at this angle of viewing. The polymeric layer 52' is coated on the predetermined areas 60, thus forming boundaries or profiles ready for dicing into interposers. Each of the predetermined areas 60 is determined as a triangular shape, wherein the polymeric layer 52' on the periphery region 56 is a strip line along edges 60A of the predetermined areas 60 and frames the core region 55. An opposite side (not shown) of each predetermined areas 60 includes a set of the dies 10 integrated as a complete system with particular functions. The quantity of the conductive bumps 65 is not limited to the illustrations in FIG. 5C. In an embodiment, there are not limited to one row of the conductive bumps 65 in the periphery region 56, instead, there are a few rows of the conductive bumps 65 arranged in the periphery region 56. Next, a singulation (not shown) is performed on the wafer 30 so as to dice the wafer 30 into interposers according to the predetermined areas 60.

Figure 6:
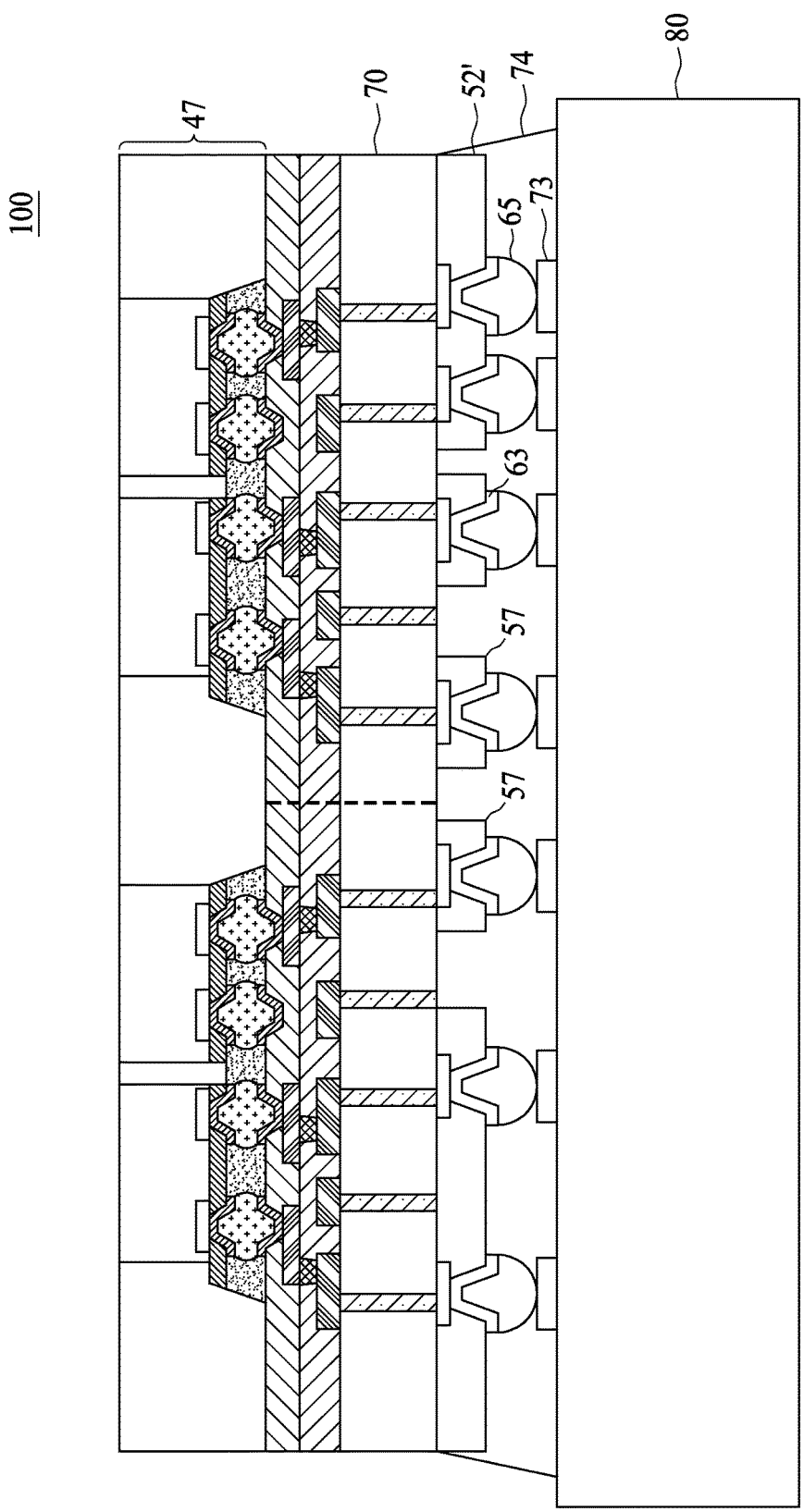
FIG. 6 represents a semiconductor package structure in accordance with some embodiments of the present disclosure.

Referring to FIG. 6, it depicts that an interposer 70 stacked with the molded chip 47 is mounted on a circuit board 80. During the mounting process with the circuit board 80, the conductive bumps 65 are in contact with conductive pads 73 of the circuit board 80. A reflow process is performed to soften the conductive bumps 65 for electrical connection and mechanical attachment between the interposer 70 and the circuit board 80. After the interposer 70 is connected to the circuit board 80, an underfill material is dispensed into gaps between the interposer 70 and the circuit board 80. Further, the underfill material is interposed between the isolated belts 57 and then cured to form an underfill layer 74. A CoWoS package 100 mounting the molded chip 47, the interposer 70 and the circuit board 80 together is formed. While the CoWoS package 100 is cooling down, the conductive bumps 65 are subject to rotational shearing, which results from the different thermal expansion between the circuit board 80 and the interposer 70 due to different thermal coefficients. For example, while cooling down, the circuit board 80 shrinks to an extent that is greater than that of the interposer 70. The conductive bumps 65 will be rotated, which causes squeezing or pulling to the joint regions with the conductive bumps 65 and forms a stress. The polymeric layer 52' is able to mitigate or disperse the rotational shearing, which transmits a stress from the conductive bumps 65 into the UBMs 63 where the UBMs 63 or the conductive bumps 65 are subject to delamination. In other situations, the CoWoS package 100 shall receive a stressing test before the products are transported to the clients. During reliability stressing, mechanical pressure is imposed on the CoWoS packages 100. The polymeric layer 52' disperses the stressing so as to protect the conductive bumps 65, the conductive pads 73, the UBMs 63, the underfill layer 74 and the underlying wirings adjacent to the edges of the interposer 70 from cracking.

In brief, a polymeric layer formed on a periphery region of an interposer is able to absorb or disperse the stress caused by different thermal expansion between the interposer and the circuit board, thus sufficiently preventing conductive bumps near edges of the interposer from cracking. In addition, the polymeric layer is able to mitigate or disperse the rotational shear, which transmits a stress from conductive bumps into UBMs and underlying wirings where the UBMs or the conductive bumps are subject to delamination.

A semiconductor package structure includes a semiconductor substrate including a plurality of through substrate vias (TSV) extending from a first surface to a second surface of the semiconductor substrate, wherein the second surface is opposite to the first surface; a plurality of conductive bumps on the second surface and connected to a corresponding TSV; a polymeric layer on the second surface and surrounding a lower portion of a corresponding conductive bump. The polymeric layer includes a first portion configured as a blanket covering a periphery region of the semiconductor substrate; and a second portion in a core region of the semiconductor substrate and configured as a plurality of isolated belts, wherein each of the isolated belts surrounds a corresponding conductive bump.

In some embodiments, the periphery region includes a bandwidth of at least 3 times that of a minimum pitch of the plurality of conductive bumps.

In some embodiments, the first portion includes a sidewall coplanar with a sidewall of the semiconductor substrate.

In some embodiments, the semiconductor package structure further includes a molded chip over the first surface, wherein the molded chip is coupled with the plurality of conductive bumps.

In some embodiments, the semiconductor package structure further includes a redistribution layer (RDL) between the molded chip and the first surface; and a plurality of conductive micro bumps interconnected to the RDL and the molded chip. The RDL is coupled with the corresponding TSV. The plurality of conductive micro bumps are smaller than the plurality of conductive bumps.

In some embodiments, the semiconductor package structure further includes a circuit board over the second surface and connected to the plurality of conductive bumps.

In some embodiments, the semiconductor package structure further includes an underfill material between the circuit board and the semiconductor substrate, wherein the underfill material is interposed between each of the isolated belts.

In some embodiments, each of the isolated belts includes an oval shape.

In some embodiments, the plurality of conductive bumps are distal from corners of the semiconductor substrate.

A semiconductor package structure includes an interposer including a front side, a back side, a first, and a second through interposer via (TIV); a polymeric layer covering a periphery region of the front side; a first conductive bump extruding from the polymeric layer and coupled with the first through interposer via; a polymeric ring over a central region of the front side; and a molded chip mounted on the back side. The polymeric ring is isolated and encompasses a second conductive bump coupled with the second through interposer via. The molded chip is coupled with the first and second conductive bumps through the first and second through interposer vias.

In some embodiments, the polymeric layer is a strip line along edges of the interposer and frames the central region.

In some embodiments, the coverage of the polymeric layer on the front side is at least 30%.

In some embodiments, the polymeric layer includes a thickness greater than a thickness of the polymeric ring.

In some embodiments, the polymeric ring includes a diameter greater than a diameter of the second conductive bump.

In some embodiments, the second conductive bump includes an oval shape.

In some embodiments, the semiconductor package structure further includes a circuit board over the front side and connected to the first and second conductive bumps.

A method for manufacturing a semiconductor package structure includes providing a wafer including a first surface and a second surface, wherein the second surface is opposite to the first surface; forming a plurality of conductive pads on the second surface; forming a polymeric layer over the second surface, wherein the polymeric layer is formed on a predetermined area of an interposer; removing a portion of the polymeric layer so as to expose the plurality of conductive pads; forming trenches in a core region of the predetermined area so as to expose a portion of the second surface, thus allowing the polymeric layer on a periphery region of the predetermined area to remain; and forming a plurality of conductive bumps extruding from the plurality of conductive pads.

In some embodiments, the method further includes determining the periphery region and the core region of the predetermined area, wherein the periphery region includes a bandwidth of at least 3 times that of a minimum pitch of the plurality of conductive pads.

In some embodiments, the method further includes determining positions of a plurality of isolated circles in the core region of the predetermined area.

In some embodiments, the method further includes mounting an integrated circuit die over the first surface of the wafer; dicing the wafer into a plurality of interposers; and mounting the plurality of interposers on a circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package structure, comprising:
a semiconductor substrate including a plurality of through substrate vias (TSV) extending from a first surface to a second surface of the semiconductor substrate, wherein the second surface is opposite to the first surface;
a plurality of conductive bumps on the second surface and connected to a corresponding TSV;
a polymeric layer on the second surface and surrounding a lower portion of a corresponding conductive bump, the polymeric layer comprising:
a first portion configured as a blanket covering a periphery region of the semiconductor substrate, and at least a portion of the conductive bumps extrude from the first portion; and a second portion in a core region of the semiconductor substrate and configured as a plurality of isolated belts, wherein each of the isolated belts surrounds a corresponding conductive bump, and the isolated belts are not in direct physical contact with each other.

2. The semiconductor package structure of claim 1, wherein the periphery region comprises a bandwidth of at least 3 times that of a minimum pitch of the plurality of conductive bumps.

3. The semiconductor package structure of claim 1, wherein the first portion comprises a sidewall coplanar with a sidewall of the semiconductor substrate.

4. The semiconductor package structure of claim 1, further comprising:
a molded chip over the first surface, wherein the molded chip is coupled with the plurality of conductive bumps.

5. The semiconductor package structure of claim 4, further comprising:
a redistribution layer (RDL) between the molded chip and the first surface, wherein the RDL is coupled with the corresponding TSV; and
a plurality of conductive micro bumps interconnected to the RDL and the molded chip, wherein the plurality of conductive micro bumps are smaller than the plurality of conductive bumps.

6. The semiconductor package structure of claim 1, further comprising:
a circuit board over the second surface and connected to the plurality of conductive bumps.

7. The semiconductor package structure of claim 6, further comprising:
an underfill material between the circuit board and the semiconductor substrate, wherein the underfill material is interposed between each of the isolated belts.

8. The semiconductor package structure of claim 1, wherein each of the isolated belts comprises an oval shape.

9. The semiconductor package structure of claim 1, wherein the plurality of conductive bumps are distal from corners of the semiconductor substrate.

10. A semiconductor package structure, comprising:
an interposer including a front side, a back side, a first, and a second through interposer vias (TIV);
a polymeric layer covering a periphery region of the front side, wherein the polymeric layer includes a first conductive bump extruding from the polymeric layer and coupled with the first through interposer via;
a polymeric ring over a central region of the front side, wherein the polymeric ring is isolated and encompasses a second conductive bumps coupled with the second through interposer via; and
a molded chip mounted on the back side, wherein the molded chip is coupled with the first and second conductive bumps through the first and second through interposer vias;
wherein the polymeric layer comprises a sidewall coplanar with a sidewall of the interposer.

11. The semiconductor package structure of claim 10, wherein the polymeric layer is a strip line along edges of the interposer and frames the central region.

12. The semiconductor package structure of claim 10, wherein the coverage of the polymeric layer on the front side is at least 30%.

13. The semiconductor package structure of claim 10, wherein the polymeric layer comprises a thickness greater than a thickness of the polymeric ring.

14. The semiconductor package structure of claim 10, wherein the polymeric ring comprises a diameter greater than a diameter of the second conductive bump.

15. The semiconductor package structure of claim 10, wherein the second conductive bump comprises an oval shape.

16. The semiconductor package structure of claim 10, further comprising:
a circuit board over the front side and connected to the first and second conductive bumps.

17. A semiconductor package structure, comprising:
a semiconductor substrate including a first surface and a second surface, wherein the second surface is opposite to the first surface;
a plurality of conductive bumps on the second surface;
a polymeric layer on the second surface and surrounding a lower portion of a corresponding conductive bump, the polymeric layer comprising:
a first portion configured as a blanket covering a periphery region of the semiconductor substrate, and the at least a portion of the conductive bumps extrude from the first portion; and
a second portion in a core region of the semiconductor substrate and configured as a plurality of isolated belts, wherein each of the isolated belts surrounds a corresponding conductive bump, and the isolated belts are not in direct physical contact with each other.

18. The semiconductor package structure of claim 17, wherein the core region is in a triangular shape.

19. The semiconductor package structure of claim 17, wherein the first portion occupies at least 30% of the total area of the first and second portions.

20. The semiconductor package structure of claim 17, wherein the first portion comprises a thickness greater than a thickness of the second portion.

* * * * *